United States Patent

Nguyen et al.

[11] Patent Number: 6,143,470
[45] Date of Patent: *Nov. 7, 2000

[54] DIGITAL LASER IMAGABLE LITHOGRAPHIC PRINTING PLATES

[76] Inventors: My T. Nguyen, 345 Claremont Ave., Montclair, N.J. 07042; Hui Zhu, 80 Crotty Ave., Yonkers, N.Y. 10704; S. Peter Pappas, 10 Rockspring Rd., W. Orange, N.J. 07052; Ken-ichi Shimazu, 494 Chappaqua Rd., Briarcliff Manor, N.Y. 10510; Robert W. Hallman, 588 Windsor Dr., Palisades Park, N.J. 07650

[ * ] Notice: This patent issued on a continued prosecution application filed under 37 CFR 1.53(d), and is subject to the twenty year patent term provisions of 35 U.S.C. 154(a)(2).

[21] Appl. No.: 08/494,617

[22] Filed: Jun. 23, 1995

[51] Int. Cl.$^7$ ........................................................ G03F 7/11
[52] U.S. Cl. .................................. 430/273.1; 430/272.1; 430/156
[58] Field of Search ................................ 430/156, 273.1, 430/272.1

[56] References Cited

U.S. PATENT DOCUMENTS

| | | | |
|---|---|---|---|
| Re. 35,512 | 5/1997 | Nowak et al. | 101/454 |
| 4,132,168 | 1/1979 | Peterson | 101/471 |
| 4,515,877 | 5/1985 | Barzynski et al. | 430/5 |
| 4,755,445 | 7/1988 | Hasegawa | 430/272.1 |
| 5,139,918 | 8/1992 | Goel | 430/166 |
| 5,171,650 | 12/1992 | Ellis et al. | 430/20 |
| 5,262,275 | 11/1993 | Fan | 430/273.1 |
| 5,478,695 | 12/1995 | Leenders | 430/273.1 |
| 5,501,938 | 3/1996 | Ellis et al. | 430/201 |
| 5,512,420 | 4/1996 | Hallman et al. | 430/156 |
| 5,719,009 | 2/1998 | Fan | 430/306 |

FOREIGN PATENT DOCUMENTS

| | | |
|---|---|---|
| 554798 | 8/1993 | European Pat. Off. . |
| 580393 A2 | 1/1994 | European Pat. Off. . |
| 720057 | 7/1996 | European Pat. Off. . |
| 6216022 | 8/1994 | Japan . |
| 9620429 | 7/1996 | WIPO . |

*Primary Examiner*—Cynthia Hamilton

[57] ABSTRACT

Lithographic printing plates for wet or waterless offset printing are disclosed which can be imagewise exposed using a digitally controlled IR laser. The invention comprises a laser imagable lithographic printing plate comprising a substrate, a photosensitive coating on the substrate, and a water soluble laser ablatable top coating containing dyes or polymers that absorb infra-red, ultraviolet and visible light. Laminated transparent polymer films and/or peelable polymeric coatings films can be interposed between the coated substrate and a water soluble and/or organic solvent soluble laser ablatable top layer to augment plate production or image inscription on the plate.

12 Claims, 4 Drawing Sheets

6,143,470

DIGITAL LASER IMAGABLE LITHOGRAPHIC PRINTING PLATES

FIELD OF THE INVENTION

This invention relates to novel long impression life laser imagable lithographic printing plates and to the method for their production. The invention especially relates to laminated lithographic printing plates for wet or waterless offset lithographic printing which can be imagewise exposed using a digitally controlled laser.

BACKGROUND OF THE INVENTION

Lithography and offset printing methods have long been combined in a compatible marriage of great convenience for the printing industry for economical, high speed, high quality image duplication in small runs and large. Known art available to the industry for image transfer to a lithographic plate is voluminous but dominated by the photographic process wherein a hydrophilic plate is treated with a photosensitive coating, exposed via a film image and developed to produce a printable, oleophilic image on the plate.

While preparing lithographic plates by photographic image transfer is relatively efficient and efficacious, it is a multi-step, indirect process of constrained flexibility. Typically, a photographically presensitized (PS) plate is prepared from a hydrophilic surface-treated aluminum. A positive or negative film image of an original hard copy is prepared and the PS plate exposed to the film image, developed, washed and made ready for print operations. Any desired changes in the film image must be made by first changing the original hard copy and repeating the photographic process; hence, the constrained flexibility. As sophisticated and useful as it is to prepare plates by photographic image transfer, the need for a lithographic plate fabricating process that obviates the above problems associated with the photographic process has long been recognized.

Clearly, it would be highly beneficial to the printing industry to directly produce a quality printable image on a plate without proceeding through a multi-step photographic process. It would also be highly efficacious if a process were developed whereby changes could be made in an original image in some predetermined manner without incurring the need to correct hard copy and repeat the photography, particularly if those changes could be made "on line". Consistent with these goals, artisans in the field of lithographic plate production have recently come to bend their efforts toward the development of a means to integrate digitally controlled image-making technology, i.e., the ubiquitous PC computer of todays world, with a means to directly convey the digital image onto a lithographic plate that will be usable for large production runs (100,000 or more copies).

Image forming by digital computer aided design of graphical material or text is well known. Electronically derived images of words or graphics presented on the CRT of a digital computer system can be edited and converted to final hard copy by direct printing with impact printers, laser printers or ink jet printers. This manner of printing or producing hard copy is extremely flexible and useful when print runs of no more than a few thousand are required but the print process is not feasible for large runs measured in the tens or hundreds of thousands of pieces. For large runs, printing by lithographic plate is still the preferred process with such plates prepared by the process of photographic image transfer.

It is known that digitized image information can be used in plate making wherein a film is made to express the image according to the image digitization and an image is formed on the plate by exposure and development. While this method augments flexibility by permitting editing of a digitized image, the method does not overcome the problems associated with the photographic image transfer method of plate fabrication.

Recently, fabrication of lithographic plates by ink jet techniques has been proposed to affect the utilization of digitally controlled lithographic plate-making. One such technique is disclosed in Japanese patent application, Kokai 62-25081. This application describes the use of an ink jet system for applying an oleophilic liquid to form an image on the hydrophilic aluminum surface of a lithographic plate. Ink jet technology, however, is in its infancy with respect to commercial lithography. Present ink jet techniques cannot produce large or commercially acceptable offset plates.

Lasers and their amenability to digital control have stimulated a substantial effort in the development of laser-based imaging systems. Early examples utilized lasers to etch away material from a plate blank to form an intaglio or letterpress pattern. See., e.g., U.S. Pat. Nos. 3,506,779: 4,347,785. This approach was later extended to production of lithographic plates, e.g., by removal of a hydrophilic surface to reveal an oleophilic underlayers. See, e.g., U.S. Pat. No. 4,054,094. These systems generally require high-power lasers which are expensive and slow.

A second approach to laser imaging involves the use of thermal-transfer materials as in U.S. Pat. Nos. 3,945,318: 3,962,513: 3,964,389: and 4,395,946. With these systems, a polymer sheet transparent to the radiation emitted by the laser is coated with a transferable material. During operation the transfer side of this construction is brought into contact with an acceptor sheet, and the transfer material is selectively irradiated through the transparent layer. Irradiation causes the transfer material to adhere preferentially to the acceptor sheet. The transfer and acceptor materials exhibit different affinities for fountain solution and/or ink, so that removal of the transparent layer together with unirradiated transfer material leaves a suitably imaged, finished plate. Typically, the transfer material is oleophilic and the acceptor material hydrophilic. Plates produced with transfer-type systems tend to exhibit short useful lifetimes due to the limited amount of material that can effectively be transferred. In addition, because the transfer process involves melting and resolidification of material, image quality tends to be visibly poorer than that obtainable with other methods.

Lasers have also been used to expose a photosensitive blank for traditional chemical processing as in U.S. Pat. Nos. 3,506,779: 4,020,762. In an alternative to this approach, a laser has been employed to selectively remove, in an imagewise pattern, an opaque coating that overlies a photosensitive plate blank. The plate is then exposed to a source of radiation with the unremoved material acting as a mask that prevents radiation from reaching underlying portions of the plate as in U.S. Pat. No. 4,132,168. Either of these imaging techniques requires the cumbersome chemical processing associated with traditional, non-digital platemaking.

U.S. Pat. Nos. 5,339,737, 5,353,705 and 5,351,617 also describe lithographic printing plates suitable for digitally controlled imaging by means of laser devices. Here, laser output ablates one or more plate layers, resulting in an imagewise pattern of features on the plate. Laser output passes through at least one discreet layer and imagewise ablates one or more underlying layer. The image features produced exhibit an affinity for ink or an ink-abhesive fluid the differs from that of unexposed areas. The ablatable material used in these patents to describe the image is deposited as an intractable, infusible, IR absorptive conductive polymer under an IR transparent polymer film. As a consequence, the process of preparing the plate is complicated and the image produced by the ablated polymer on the plate does not yield sharp and distinct printed copy.

In conventional planographic printing, a printing plate bearing as oleophilic, ink receptive image is first dampened with an aqueous fountain solution to prevent ink from wetting the hydrophilic, non-image bearings areas of the printing plate, after which an oil-based ink is rolled over the plate to selectively coat the now printable image. Conventional planographic printing has some difficulties inherent in having both an oleophilic ink and an aqueous fluid cojoined in the same press. First, the fountain solution applied to the printing plate flows back into the train of inking rollers on the press, causing emulsification of the ink. Secondly, it is difficult to maintain control of the delicate balance needed between the amounts of ink and the amount of fountain solution applied to the printing plate. Consequently, the image fidelity and uniformity are difficult to maintain. Thirdly, the fountain solution tends to flow forward over the offset cylinder, moistening the copy paper and causing its dimensional change. Fourthly, in the case where printing is imaged directly by electrophotography, the imaged printing plate must be subjected to an etching treatment and the printing operation becomes complicated.

Considerable effort has been applied in the industry directed toward the development of lithographic printing plates that may overcome some of the foregoing problems. A significant portion of that effort has been directed toward the development of planographic plates that don't need a fountain solution circulating in the printing apparatus to accomplish the printing function. These plates are referred herein as waterless plates or dry plates. For these waterless plates, the circulating fountain solution is avoided by the discovery of various printing methods and plate compositions that do not rely on the induced hydrophilicity of a portion of the plate to distinguish an oleophilic image surface from a non-oleophilic non-image surface.

SUMMARY OF THE INVENTION

The discovery intrinsic to the present invention relates to the formulation and use of materials that absorb light in the infra-red, ultraviolet and visible portions of the electromagnetic (EM) spectrum as a top coating on any of the known variety of photographically presensitized lithographic printing plates. When treated imagewise with a digitally controlled infra-red laser, the infra-red absorbing materials in the top coat directly under the laser beam ablate. Associated conductive heat transfer causes the covaporization of the ultraviolet and visible light absorbable materials in the image zone. The void formed in the top coat describes the intended image by the absence of light absorbable material, but it is not of printable quality. However, the void is now transparent to IR, UV and visible light. When the presensitized plate is flood exposed to UV light of contact speed, the plate photosensitive first layer is imagewise exposed through the void. Development of the exposed plate by conventional methods yields an imagebearing plate that can be used to print large numbers of copies.

The essence of the invention is embodied in several different novel compositions of printing plates intended to meet several different levels of cost/performance advantage for digitized image production on the plate. Broadly, the invention comprises a laser imagable lithographic printing plate comprising a substrate, a photosensitive coating on the substrate, and a water soluble laser ablatable top coating that absorbs infra-red, ultraviolet and visible light.

For a preferred embodiment of the invention the photosensitive plate, in addition to the top coat, has a peelable adhesive coating on the photosensitive coating and a polymeric film transparent to infra-red, ultraviolet and visible light between the peelable coating and top coating.

In another embodiment, the photosensitive plate, in addition to the top coat, has a water soluble polymer coating between the photosensitive coating and the top coating but does not include the foregoing peelable adhesive coating.

The plates of the invention may be prepared as waterless lithographic printing plates comprising a silicon coating on the photosensitive coating and a polymeric film transparent to infra-red, ultraviolet and visible light between the silicon coating and the top coating. Preferably, the top coating is soluble in organic solvents.

The top coating used in the plate of the present invention may comprise a resin plus UV, visible and IR absorbing dyes or a polymer which itself absorbs in the cited regions of the EM spectrum, augmented or unaugmented by dyes.

DETAILED DESCRIPTION OF THE INVENTION

Figure 1:
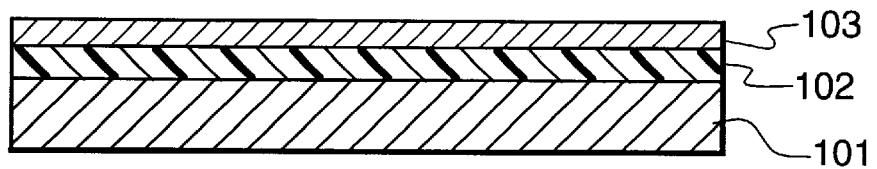
FIG. 1 is an illustration of Direct IR Ablatable Plate.
Figure 1:
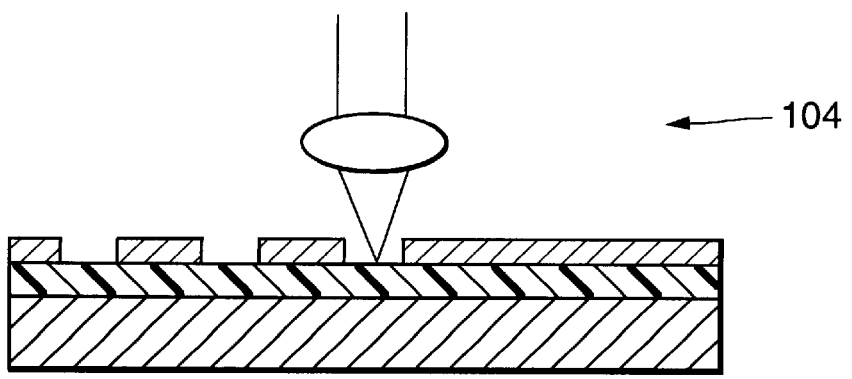
Figure 1:
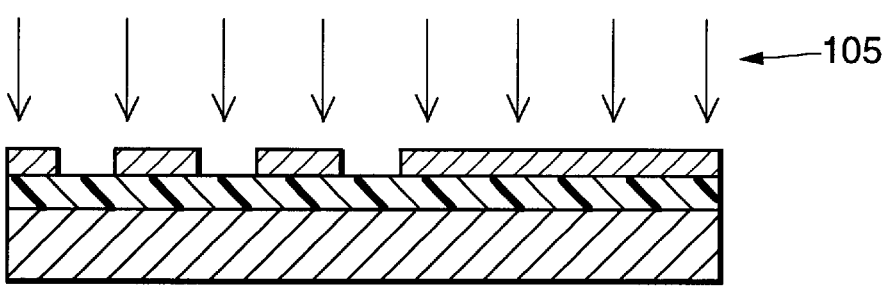
Figure 1:
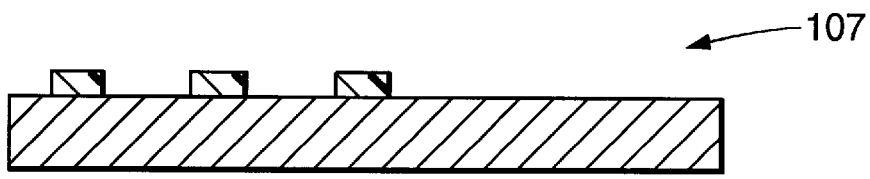

The novel lithographic plates of the instant invention permit the direct formation of printable images on plates by digital computerization without the intervening formation of a photographic image with a quality that allows the plates to be used for high volume printing applications of 50,000 to 1,000,000 or more copies. Basically, several related plate compositions have been discovered that utilize computer-driven infra-red (IR) lasers to inscribe an image on a coating surface by chemical ablation induced by IR light absorbtion. The severality of the compositions derives from various coatings or films that may be interposed between the ablatable coating and the plate substrate, typically aluminum, in order to avoid production and application related performance problems and provide a cost effective solution to the challenge of computer-imaging of high volume lithographic plates.

Generally, the major problems to overcome to use an IR laser to inscribe a printable image on a presensitized (PS) lithographic plate are these:

i. insulating the PS aluminum substrate from the potentially damaging effects of conductive heat tranfer from IR induced chemical ablation;

ii. finding a coating that will ablate rapidly under IR light to leave a sharp image and not induce conflicting chemical reactions such as delamination in the coating or subcoatings;

iii. finding a suitable combination of coatings with solubility and/or laminating properties that allow easy removable of the coating from the plate but can be applied at high speed plate production rates;

iiii. discovering a combined solution to the foregoing challenges that is cost/performance effective.

The support or substrate for the printing plate of the instant invention may be any of those supports or substrates that are commonly used as supports in the manufacture of printing plates. Examples include metal plates such as aluminum, composite metal plates, plastic films including polyesters such as polyethylene terephthalate, paper and the like. Aluminum is the preferred substrate.

The foregoing substrates are converted to photographically presensitized (PS) lithographic plates by coating the plates with a material sensitive to light at contact speed. The first coating on the substrate comprises a coating sensitive to light at contact speeds which yields a lipophilic image and includes light sensitive coatings conventionally used in light sensitive lithographic printing plates. The term lipophilic means that the image repels water for wetting in printing and receives oily ink. Examples of compositions constituting such light sensitive coatings are described in U.S. Pat. No. 4,299,912 and in the patents assigned to Polychrome Corp. and incorporated by reference including U.S. Pat. Nos. 4,350,753, 4,348,471 and 3,635,709. They include by example without limitation: compositions comprising one or more diazo resins; compositions comprising one or more o-naphthoquinonediazide compounds; compositions comprising one or more light sensitive azide compounds; compounds comprising one or more polymers containing an alpha, beta unsaturated carbonyl group in the main or side chain thereof; and photopolymerizable compositions comprising one or more addition polymerizable unsaturated compounds.

As used herein, by light sensitive first layer or coating capable of being used as the light sensitive layer in a negative-working presensitized printing plate is meant a layer which can be coated onto the base and which is sensitive to light such as ultra-violet light and when exposed to such undergoes goes a chemical reaction which renders the exposed areas insoluble leaving the unexposed areas dissoluble. By light sensitive first layer or coating capable of being used as the light sensitive layer in a positive-working presensitized printing plate is meant any light sensitive composition that is sensitive to light such as ultraviolet light and when exposed to such light undergoes a chemical reaction in the exposed areas whereby the exposed areas become soluble and removable.

An example of a positive working resin composition which can be developed with an alkaline solution is one which contains a light sensitive material such as o-naphthoquinonediazide. Examples of negative working resin compositions which can be developed following UV light exposure include polvinylcinnamate, vinyl polymers containing an aromatic azide group and the like. The photographic speed of these compounds is too slow for plates sensitized therewith to be of camera speed and thus, as previously stated, most presensitized (PS) lithographic plates are of contact speed.

U.S. Pat. Nos. 4,483,758 and 4,447,512, assigned to Polychrome Corp. and incorporated herein by reference, teach negative working compositions consisting of diazo resin based on diphenyl amine sulfate condensate with formaldehyde and isolated as 2-hydroxy-4-methoxy-benzophenone-5-sulfonic acid salt. Also included are polymers with alpha, beta unsaturated carbonyl groups in the main or side chain.

Preferred PS lithographic plates useful in the present invention obtainable from Polychrome Corp. include Vistar-M plate, Vistar-XLR plate and Vitesse/HSP plate.

Contact speed coatings used in the present invention to produce PS plates have speeds between about 200 and 1000 $mj/cm^2$, but preferably about 400 $mj/cm^2$. Contact exposure speed or low speed coatings require substantially higher energy levels of light to impinge upon the coating to produce a chemical change in the coating and a corresponding imaging effect when compared with camera speed coatings. Camera speed or high speed means that the coating is sufficiently fast, i.e., photographically light sensitive, to be used in a camera such as a process camera. However, the purpose of the present invention is to obviate the need to employ a process camera and the associated photographic process to create a printable image on a lithographic plate.

To accomplish the objectives of the present invention four different types (I–IV) of related lithographic printing plates which contain laser ablative layer or masks have been discovered. These plates are prepared by coating the laser ablative layer directly onto a conventional wet or waterless PS lithographic plate such as those described above and available from Polychrome Corp. Each plate can be imagewise inscribed using a digitally driven IR laser to ablate a portion of the top coat. However, it should be noted that it is not necessary to completely ablate the coating in the image areas upon exposure to the infra-red laser light in order to obtain clean printing images.

The top laser ablatable coating used in the plate of the present invention comprises a binder resin plus UV, visible and IR absorbing dyes. Instead of a top coating of resin-bound dyes, however, a polymer or copolymer can be used which itself absorbs in the cited regions of the EM spectrum, augmented or unaugmented by dyes. Table 2 list dyes and binders useful in the present invention. As to useful ablatable polymer coatings, these include carboxy or sulfonate substituted polypyrrole, polythiophene or polyaniline. The substitutent carboxylic acid group or sulfonic acid group confers water solublity on the polymer.

I. Direct IR Ablatable Plate

The structure of these plates is shown in FIG. 1 which also illustrates the steps of the imaging process. Referring to FIG. 1, these plates consist of three layers which are the aluminum substrate (101), the photosensitive layer (102) either negative or positive and the laser ablative layer (103). The compositions used for coating of the laser ablative layer must be soluble in aqueous solutions. This requirement avoids the dissolution of the photosensitive layer during application of the laser ablative layer on the PS layer. Water solubility also makes it easier to remove the top abalatable layer during image development of the plate. Examples 1 and 2 describe the process for the preparation of the chemical developable along with the exposure and development imaging process illustrated in FIG. 1.

In the Examples, unless otherwise indicated, percentages are expressions of weight percent.

EXAMPLE 1

Two grams of Airvol 203 (polyvinyl alcohol available from Air Product), 2 g of water soluble nigrosine—a UV-Visible dye available from Spectra Color, New Jersey, and 2 g of Acid Blue Green PINA 780—a water soluble IR dye available from Hoetsch, Michigan, were dissolved in 100 g of deionized water. The mixture was coated on the Vistar-XLR plate of Polychrome Corp using a wire-wound rod and dried using hot air to produce a uniform coating with a coating weight of 2 $g/m^2$. The printing image was written on the plate by using an infra-red (104) laser ($\lambda$=870 nm) as illustrated in FIG. 1. The plate was then flood exposed under UV-Visible light (105), then developed using Polychrome's 950 developer to produce a clean printing image lithographic plate (107).

EXAMPLE 2

The solution for coating of the laser ablatable layer was prepared as described in Example 1. Water soluble nigrosine was replaced with direct black 22—a UV-Visible dye available from Spectra Color, in the formulation. The solution was coated on the Vistar-XLR Plate of Polychrome Corp. using a wire-wound rod and dried with hot air to produce a uniform coating having a coating weight of 2 g/m$^2$. The printing image was inscribed on the coated plate by using an infra-red laser. The plate was flood exposed under UV-Visible light, then developed using the 950 developer of Polychrome Corp. as described in Example 1 to produce a clean printing image.

II. Buffered IR Ablatable Plate

Figure 2:
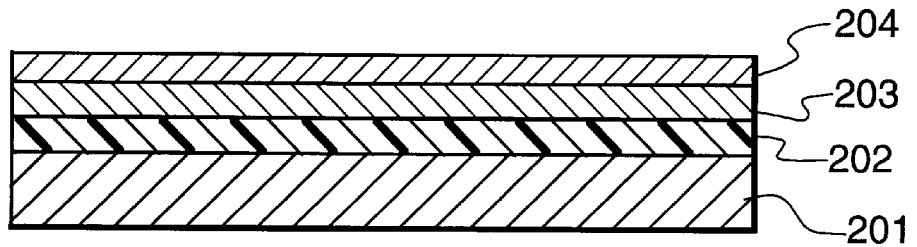
FIG. 2 is an illustration of Buffered IR Ablatable Plate.
Figure 2:
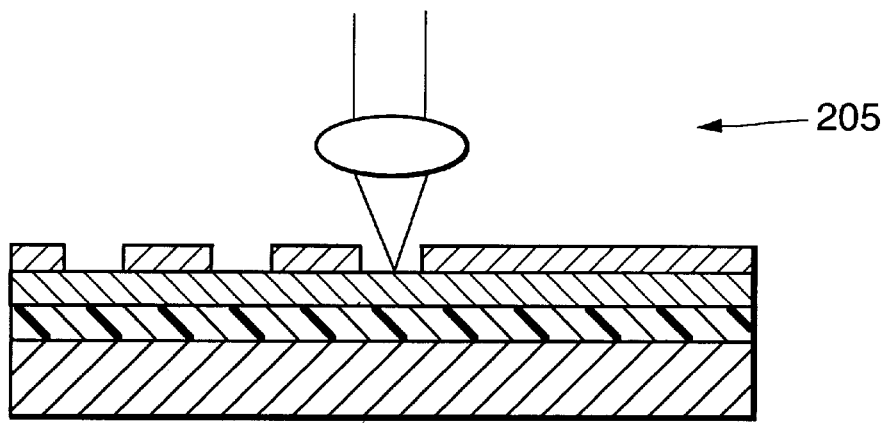
Figure 2:
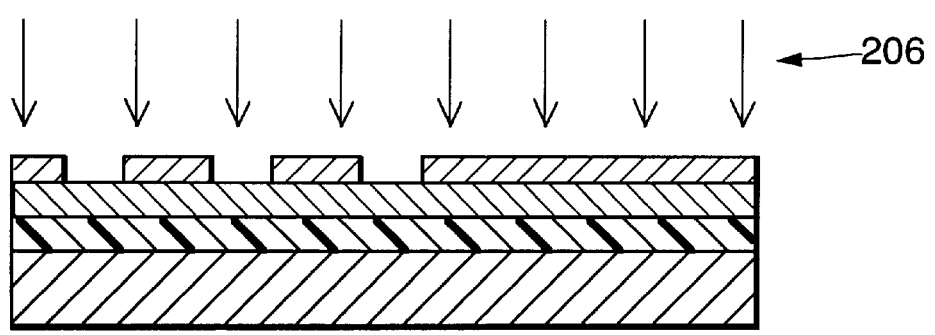
Figure 2:
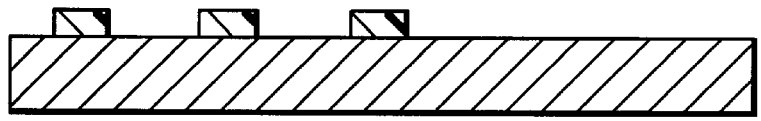

The structure of these plates is shown in FIG. 2 which also illustrates the steps of the imaging process. Referring to FIG. 2, on aluminum substrate (201), these plates contain a buffer layer (203) between the photosensitive (202) and laser ablative layers (204). The laser ablatable layer is water soluble. The buffer layer is used to enhance the rate of laser ablation since it acted as a heat barrier to prevent heat transfer from the laser ablative layer to the aluminum substrate during laser imaging. The buffer layer is also used to enhance the shelf life of the plates since it acted as a chemical barrier to prevent chemical interaction between the laser ablative and photosensitive layers during storage. The polymer used for the buffer layer is transparent to UV-Visible light and is soluble only in water. The later property allows coating of the laser ablative layer using organic solvents. However, the binder resin used for preparation of the coating comprising the laser ablatable layer must be soluble in both organic and aqueous solutions. Polyvinylpyrrolidone has been found suitable for this application. Examples 3–7 describe the process for the preparation of the buffered IR ablatable plate along with the exposure and development imaging process illustrated in FIG. 2.

EXAMPLE 3

Two grams of polyvinylpyrrolidone K90, available from GAF, 2 g of spirit nigrosine, available from Dye Specialties, and 2 g of Cyasorb IR99, available from Glendale Protective Technology, were dissolved in 120 g of solvent mixture containing 30% methyl cellosolve (2-methoxy ethanol), methanol (20%), dioxalane (28%), dimethyl formamide (21%) and (0.5%) Fluorad FC430—a fluorinated surfactant available from 3M. The solution was filtered to remove the solid residue then coated on the Vitesse/HSP plate of Polychrome Corp. using a spin coater to produce a uniform coating with a coating weight of 2 g/m$^2$. The coating weight of the photosensitive and the buffer layers is 2.8 and 1.8 g/m$^2$, respectively. Referring to FIG. 2, the image was inscribed on the plates by using an infra-red laser (205) with a power between 600 and 800 mJ/cm$^2$. The plate was flood exposed under UV-Visible light of 20 mJ/cm$^2$ (206) then baked 94° C. for 1 minute. Finally, the plate was developed using Polychrome's negative plate 900 developer to produce a clean printing image.

EXAMPLE 4

The solution for coating of the laser ablatable layer was prepared similarly to that described in Example 3. Cyasorb IR99 was replaced with Epolite IV-62B, available from Epoline, Newark, N.J., in the formulation. The solution was coated on the Vitesse/HSP using a spin coater to produce a uniform film with a coating weight of 2 g/m$^2$. The image was inscribed on the plate by an infra-red laser with a power between 600 and 800 mJ/cm$^2$. The plate was flood exposure under UV-Visible light at 20 mJ/cm$^2$ and then baked at 94° C. for 1 minute. Finally, the plate was developed using the Polychrome 900 developer to produce a clean printing image.

EXAMPLE 5

The solution for coating of the laser ablatable layer was prepared similarly to that described in the Example 3. Cyasorb RP99 was replaced in the formulation with Projet 90ONP available from Zeneca. The solution was coated on the Vitesses/HPS plate by using a wire-wound rod to produce a uniform film with a coating weight 2 g/m$^2$. The image processing for this plate was performed similar to Example 3 to produce a clean printing image.

EXAMPLE 6

The solution for coating of the laser ablatable layer was prepared similarly to that described in Example 3. Projet 86ONP, available from Zeneca, was used in place of of Cyasorb IR99. The solution was coated on the Vitesses/HSP plate by using a wirewound rod to produce a uniform film with a coating weight 2 g/m$^2$. The image processing for this plate was performed similar to above Example 3 to produce a clean printing image.

EXAMPLE 7

The solution for coating of the laser ablatable layer was prepared similarly to that described in Example 3. Heliogen Green L8730, available from Hoetsch, was used in place of Cyasorb IR99. The solution was coated on the Vitesses/HSP plate by using a wire-round rod to produce a uniform film with a coating weight 2 g/m$^2$. The image processing of this plate was performed similarly to that of Example 3 to produce a clean printing image.

III. Peelable Film Laminate Plates

Figure 3:
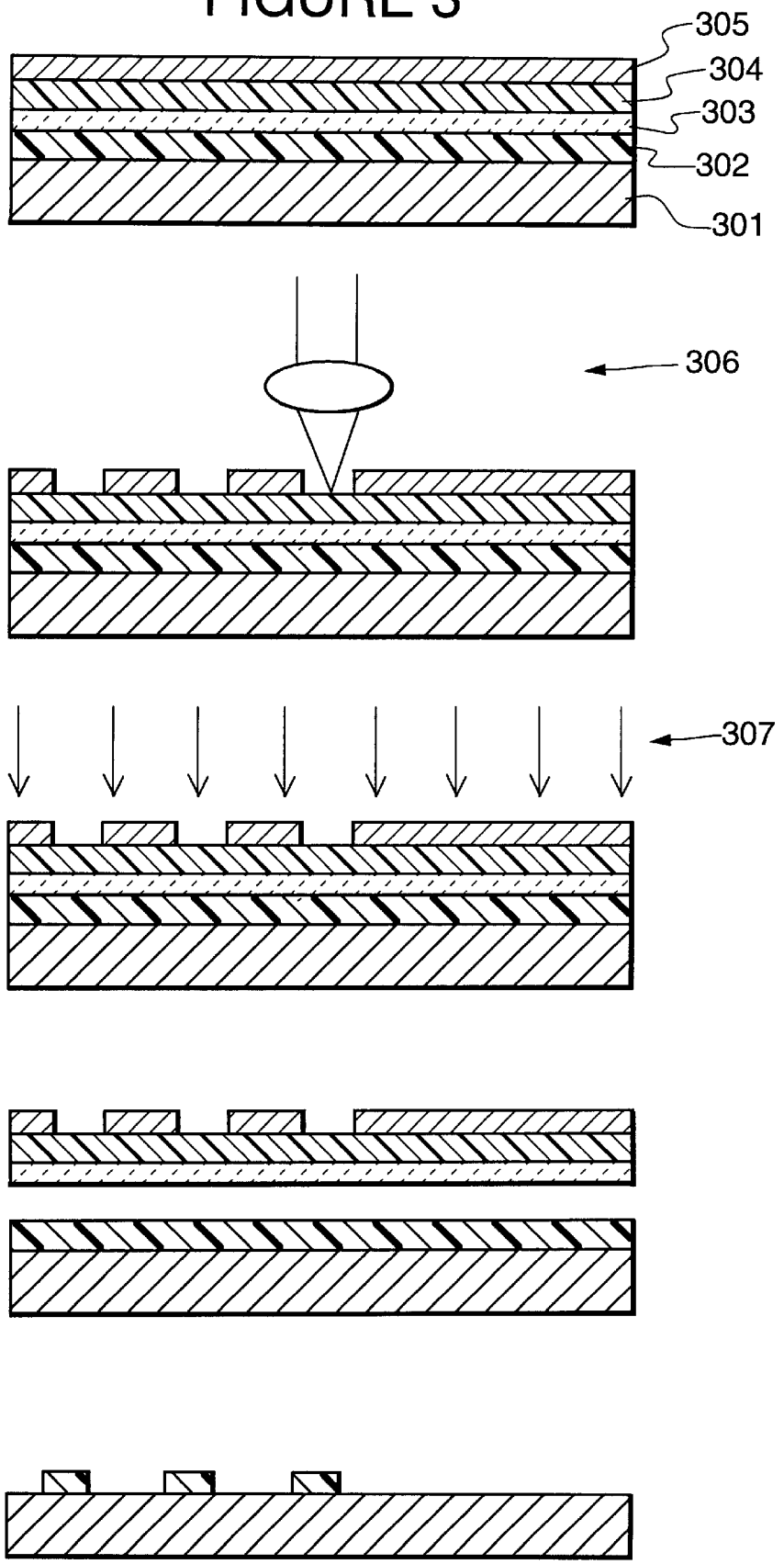
FIG. 3 is an illustration of Peelable Film Laminate Plates.

The structure of these plates is shown in FIG. 3 which also illustrates the steps of the imaging process. Referring to FIG. 3, on PS aluminum substrate (301), these plates contain a photosensitive layer (302), a removable adhesive layer (303), a polymeric film (304) and laser ablatable top layer (305). The laser ablatable layer may be soluble in water, organic solvents, or both. The laser ablatable top layer (305) is coated on the topside of the support polymeric film (304), i.e, Mylar, polypropylene, polyethylene or polyethylene terephthalate. The other side of the support film is coated with the removable adhesive layer (303) which is available from 3M. The adhesive bearing film is laminated onto the wet PS lithographic printing plates, available from Polychrome Corp.

The top layer (305) contains the following:

i. infrared absorbing dyes to enhance the laser ablation;
ii. UV-Visible absorbing dyes to prevent the transmission of UV-Visible light;
iii. binder resins and
iiii. other additives such as surfactants and adhesion promoters to enhance the film forming.

The second layer (304) is an organic insoluble and tough polymeric film which does not absorb UV-Visible and IR light. The next layer (303) is a removable adhesive film which is preferred to have a peel strength less than 0.5 lb/in$^2$.

The substrate layer (301) is preferably a smooth or anodized aluminum coated with a photosensitive coating layer (302) as currently used in the production of positive or negative wet or waterless lithographic printing plates.

Examples 8–14 in Table 1 describe typical formulations for preparing the top ablatable coating used for the peelable film laminate plates of the invention. The following Examples 16–17 also illustrate the preparation of peelable film laminate plates.

EXAMPLE 16

Polypropylene film (thickness 0.5 Du Pont) was sprayed with a thin layer of remount adhesive (3M). This film was then laminated on the Vistar-M plate at room temperature. The solution for coating the laser ablative layer was prepared by dissolving 2 g of polyvinylpyrrolidone K90, 2 g of spirit nigrosine, and 2 g of Cyasorb IR99 in 120 g of solvent mixture containing methyl cellosolve (30%), methanol (20%), dioxalane (29%), dimethyl formamide (21%) and FC430 (0.5%). The solution was filtered to remove the solid residue. The coating solution was then coated on the above laminated Vistar-M plate using a spin coater to produce a uniform coating with a coating weight of 2 $g/m^2$.

The image was inscribed on the plates by using referring to FIG. 3 an infra-red laser (306) with a power between 600 and 800 $mJ/cm^2$. The plate was flood exposed under UV-Visible light (307) and the laminated film was physically removed. Finally, the plate was developed using the 955 developer to produce a clean printing image.

EXAMPLE 17

Mylar film (0.2 mil, Du Pont) was sprayed with a remount adhesive then laminated on the Vistar-XLR plate. The solution for coating the laser ablative layer was prepared similar to the above Example 16 but Polyvinylpyrrolidone K90 was replaced with nitrocellulose. The solution was coated on the above laminated Vistar XLR plate using a spin coater to produce a uniform film with a coating weight of 2 $g/m^2$.

The image was inscribed on the plates by using an IR laser with a power between 600 and 800 $mJ/cm^2$. The plate was flood exposed under UV-Visible light and the laminated film was physically removed. Finally, the plate was developed using the Polychrome's negative plate PC950 developer to produce a clean printing image.

IV. Peelable Positive and Negative Waterless Plates

Figure 4:
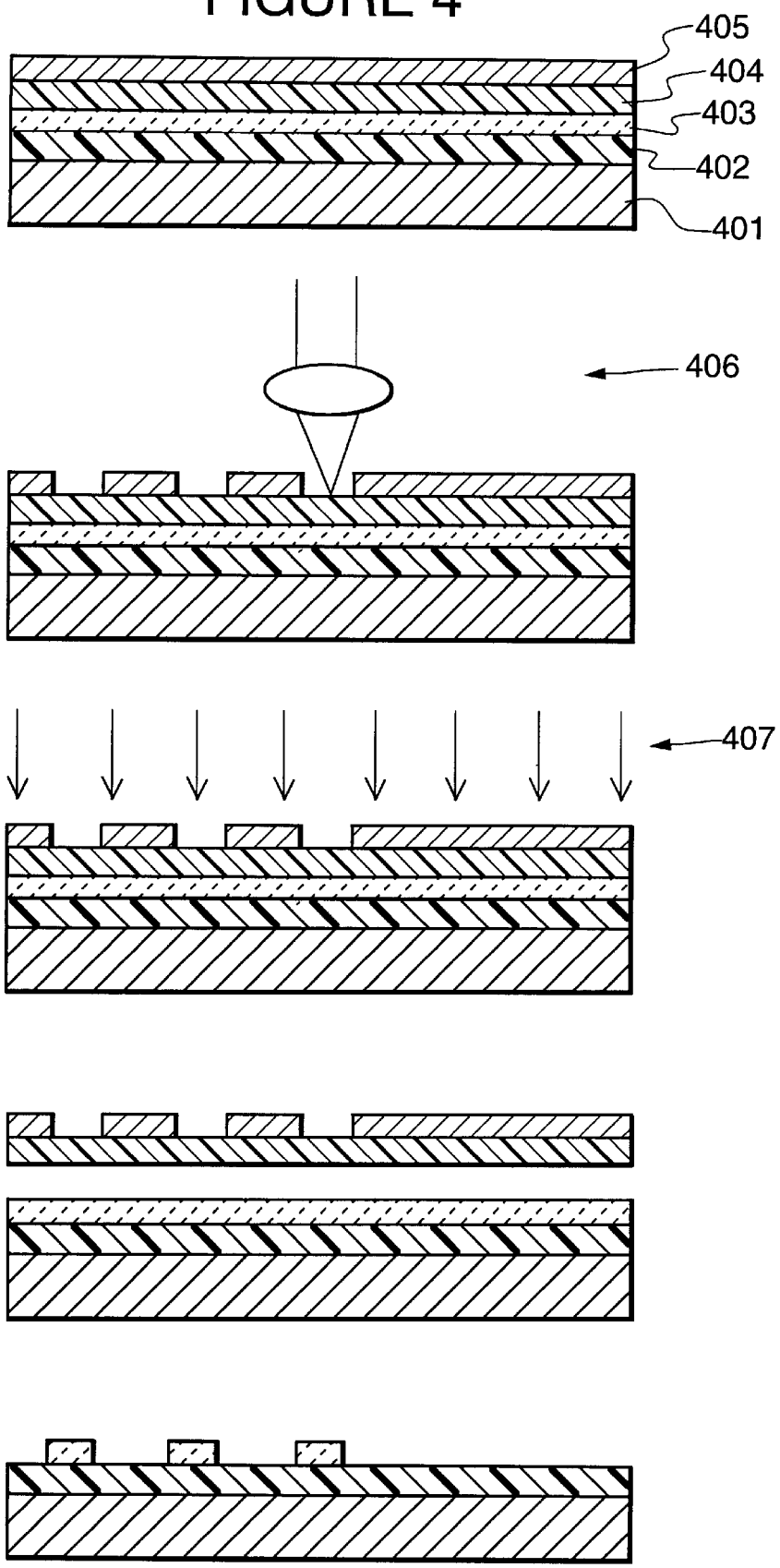
FIG. 4 is an illustration of Peelable Positive and Negative Waterless Plates.

The structure of the peelable waterless plates is shown in FIG. 4 which differs for positive or negative plates only in that the PS plate used is either a positive or negative PS plate, preferably a Torays™ negative or positive plate. Referring to FIG. 4, the plate consists of five layers, i.e., an aluminum substrate (401), a photosensitive layer (402), a silicon layer (403), a polypropylene protective layer (404) and a laser ablatable layer (405). The laser ablatable layer may be soluble in water, organic solvents, or both. The following Examples 18 and 19 describe fabrication and image processing for the peelable waterless positive and negative plates.

TABLE 1

| Components (Suppliers) | Examples | | | | | | |
|---|---|---|---|---|---|---|---|
| | 8 | 9 | 10 | 11 | 12 | 13 | 14 |
| | | | | Parts | | | |
| IR-dyes | | | | | | | |
| Project 900NP (Zeneca) | 1 | — | — | — | 1 | 1 | — |
| Cyasorb IR-99 (Glendale) | — | 1 | — | — | — | — | — |
| Epolite IV-62B (Epoline) | — | — | 1 | — | — | — | — |
| Spirit Nigrosine SJ DS-3091 (Dye specialties) | — | — | — | 10 | — | 9 | 10 |
| UV-Vis dyes | | | | | | | |
| Sudan Black B (Aldrich Chemical) | 9 | 9 | 9 | — | — | — | — |
| Savinyl Black (Sandoz) | — | — | — | — | 9 | — | — |
| Binder resins | | | | | | | |
| Acryloid A21 (Rohm & Hass) | 10 | 10 | 10 | 10 | 10 | 10 | — |
| Resyn 28-2930 (Nat'l Starch) | — | — | — | — | — | — | 10 |
| Surfactants | | | | | | | |
| Fluorad FC403 | 0.1 | 0.1 | 0.1 | 0.1 | 0.1 | 0.1 | 0.1 |
| Solvents | | | | | | | |
| DS-Solvent system* | 80 | 80 | 80 | 80 | 80 | 80 | 80 |

DS-Solvent system consists of 30% methyl cellosolve, 20% methanol 28% dioxalane, 1% dimethyl formamide and 21% methyl ethyl ketone.

EXAMPLE 18

Peelable Positive waterless Plate

Two grams of polyvinylpyrrolidone K90, 2 g of spirit nigrosine and 2 g of Cyasorb IR99 were dissolved in 120 g of solvent mixture containing methyl cellosolve (30%), methanol (20%), dioxalane (28%), dimethyl formamide (21%) and FC430 (0.5%). The solution was filtered to remove the solid residue then coated on the positive Torays™ waterless plate using a spin coater to produce a uniform coating with a coating weight of 2 $g/m^2$. The positive waterless Toray™ plate is available from Polychrome Corp. and described in U.S. Pat. Nos. 3,894,873, 4,259,905 and 4,342,820.

Referring again to FIG. 4, the image was inscribed on the plates (negative or positive) by using an infra-red laser (406) with a power between 600 and 800 $mJ/cm^2$. The plate was flood exposed under UV-Visible light (407) (500 $mJ/cm^2$) and then laminated film was peeled off. Finally, the plate was developed using an organic developer isoparaffin mixture to produce a clean printing image.

EXAMPLE 19

Peelable Negative waterless Plate

The same coating solution prepared in Example 18 and coated on a negative waterless Toray™ plate using a roll coater to produce a uniform film with a coating weight of 2 $g/m^2$. The image processing was performed as described in Example 18.

The scope of the processing conditions useful for the product of a superior printable image in the plate of the instant invention cover a broad spectrum of IR and UV dye concentrations, laser and buffer coating weights, laser ablation power and flood exposure power. Preferred conditions are:

concentration of IR dye in the coating is preferably between 5 and 50 weight percent;

concentration of UV-visible dye in the coating is preferably between 10 and 50 weight percent;

coating weight of the laser ablative layer is preferably between 1.6 and 3.0 g/m$^2$ coating weight of the buffer layer is preferably between 1.5 and 3.0 g/m$^2$;

laser ablation power is preferably between 400 and 800 mJ/cm$^2$;

flood exposure power is preferably between 10 and 500 mJ/cm$^2$.

The flood exposure requires high exposure energy and the ease of chemical development varies with the composition of the ablatable layer for the plates of the instant invention.

Table 2 lists the commercially available binder resins, additives, IR dyes and UV-visible dyes that have been found especially useful in the instant invention. an inspection of this list by one skilled in art readily suggests other related materials which will also be useful; hence, this list is not provided to present useful materials with exclusivity but to illustrate resins, additives and dyes that are preferred in the preparation of the plates of the invention.

TABLE 2

| TRADE NAMES | CHEMICAL NAMES | SUPPLIERS |
| --- | --- | --- |
| Binder resins | | |
| Acryloid Haas | Acrylic resin | Rohm & |
| Airvol 203 Prod. | Polyvinyl alcohol | Air |
| Resyn 28-2930 Starch | Carboxy. Vinyl Acetate | Nat'l |
| Scripset 540 | Poly(styrene-co-MA) | Monsanto |
| Additives | | |
| Fluorad FC430 | Fluoronated surfactant | 3M |
| IR-Dyes | | |
| Acid blue green 780-PINA | | Hoetsch |
| Cyasorb IR99 | Aromatic amine salt | GPC |
| Epolite IV-62B | Aromatic amine-SbF6- salt | Epoline |
| Heliogen Green L8730 | | BASF |
| Projet 900 NP | Phthalocyanine pigments | Zeneca |
| Projet 860 NP | Phthalocyanine pigments | Zeneca |
| UV-visible dyes | | |
| Direct black 22 | Polyazo dye | Spectra Color |
| Sudan Black B | Neutral Disazo dye | Aldrich |
| Savinyl black | Sulfur dye | Sandoz |

What is claimed is:

1. A laser imagable lithographic printing plate comprising a substrate; a negative or positive photosensitive coating atop said substrate; and a water soluble laser ablatable coating atop said photosensitive coating, consisting of a polymer that absorbs infra-red, ultraviolet and visible light.

2. A laser imagable lithographic printing plate of claim 1 wherein said substrate comprises aluminum plate or polyester film.

3. A laser imagable lithographic printing plate of claim 1 further comprising a water soluble polymer coating transparent to ultraviolet and visible light between said photosensitive coating and said water soluble laser ablatable coating.

4. A laser imagable lithographic printing plate of claim 3 wherein said water soluble polymer coating comprises polyvinyl alcohol, polyvinyl pyrrolidone, polyvinyl pyridinium halide, a polymeric acid, or nitrocellulose having a molecular weight between 5,000 and 500,000.

5. A laser imagable lithographic printing plate of claim 1 further comprising:

a peelable adhesive coating on said photosensitive coating; and a polymeric film transparent to infra-red, ultraviolet and visible light between said peelable coating and said water soluble laser ablatable coating.

6. A laser imagable lithographic printing plate of claim 5 wherein said adhesive coating has a peel strength of less than 0.5 lbs per square inch.

7. A laser imagable lithographic printing plate of claim 5 wherein said adhesive coating comprises a removable acrylate, urethane or siloxane adhesive coating.

8. A laser imagable lithographic printing plate of claim 5 wherein said polymeric film comprises polyester or polyolefin.

9. A laser imagable lithographic printing plate of claim 1 further comprising:

a silicon coating on said photosensitive coating; and a polymeric film transparent to infra-red, ultraviolet and visible light between said silicon coating and said water soluble laser ablatable coating.

10. A laser imagable lithographic printing plate of claim 1 wherein said photosensitive coating is a positive photosensitive coating.

11. A laser imagable lithographic printing plate of claim 1 wherein said photosensitive coating is a negative photosensitive coating.

12. The laser imagable lithographic printing plate of claim 1 wherein the polymer that absorbs infra-red, ultraviolet and visible light contains carboxy or sulfonate substituted polypyrrole, polythiophene or polyaniline.

* * * * *